US012796078B2

(12) United States Patent
Smith

(10) Patent No.: US 12,796,078 B2
(45) Date of Patent: Nov. 10, 2026

(54) APPARATUS INCLUDING ADJUSTED WELLS AND METHODS OF MANUFACTURING THE SAME

(71) Applicant: Micron Technology, Inc., Boise, ID (US)

(72) Inventor: Michael A. Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 569 days.

(21) Appl. No.: 17/898,184

(22) Filed: Aug. 29, 2022

(65) Prior Publication Data

US 2024/0072057 A1 Feb. 29, 2024

(51) Int. Cl.

| | |
|---|---|
| ***H10D 84/85*** | (2025.01) |
| ***H10D 30/01*** | (2025.01) |
| ***H10D 30/60*** | (2025.01) |
| ***H10D 62/17*** | (2025.01) |
| ***H10D 64/01*** | (2025.01) |
| ***H10D 64/27*** | (2025.01) |
| ***H10D 84/01*** | (2026.01) |
| ***H10D 84/03*** | (2025.01) |
| ***H10W 10/00*** | (2026.01) |
| ***H10W 10/30*** | (2026.01) |

(52) U.S. Cl.

CPC ....... *H10D 84/859* (2025.01); *H10D 30/0223* (2025.01); *H10D 30/60* (2025.01); *H10D 62/371* (2025.01); *H10D 64/01* (2025.01); *H10D 64/512* (2025.01); *H10D 64/514* (2025.01); *H10D 84/0181* (2025.01); *H10D 84/0191* (2025.01); *H10D 84/038* (2025.01); *H10W 10/031* (2026.01); *H10W 10/30* (2026.01)

(58) Field of Classification Search

CPC .... H10D 84/859; H10D 64/01; H10D 64/512; H10D 64/514; H10D 84/0181; H10D 84/0191; H10D 84/038; H10D 30/60; H10D 30/0223; H10D 62/371; H10D 30/601; H10D 64/671; H10D 62/116; H01L 21/761; H10W 10/031

See application file for complete search history.

(56) References Cited

U.S. PATENT DOCUMENTS

| | | | | |
|---|---|---|---|---|
| 7,084,465 B2 * | 8/2006 | Shibata | H10D 84/859 | 257/213 |
| 10,686,047 B2 * | 6/2020 | Kung | H10D 64/513 | |
| 2004/0159893 A1 * | 8/2004 | Kitahara | H10D 62/021 | 257/E29.267 |

* cited by examiner

*Primary Examiner* — Jose R Diaz

(74) *Attorney, Agent, or Firm* — Dorsey & Whitney LLP

(57) ABSTRACT

Semiconductor devices including an adjusted bottom/deep well embedded in a semiconductor substrate. The adjusted bottom/deep well having one or more characteristics resulting from being formed using or through a temporary masked layer.

10 Claims, 6 Drawing Sheets

APPARATUS INCLUDING ADJUSTED WELLS AND METHODS OF MANUFACTURING THE SAME

TECHNICAL FIELD

The present technology is directed to apparatuses, such as semiconductor devices including memory and processors, and several embodiments are directed to semiconductor devices that include adjusted n-wells.

BACKGROUND

The current trend in semiconductor fabrication is to manufacture smaller and faster devices with a higher density of components for computers, cell phones, pagers, personal digital assistants, and many other products. However, decrease in circuit size can lead to other unanticipated issues. For example, decreasing the footprint of each transistor (e.g., the distances between the components therein) and/or decreasing the distance between transistors often increases noise levels and unintended current flows within or across the components/circuits.

DETAILED DESCRIPTION

Figure 1A:
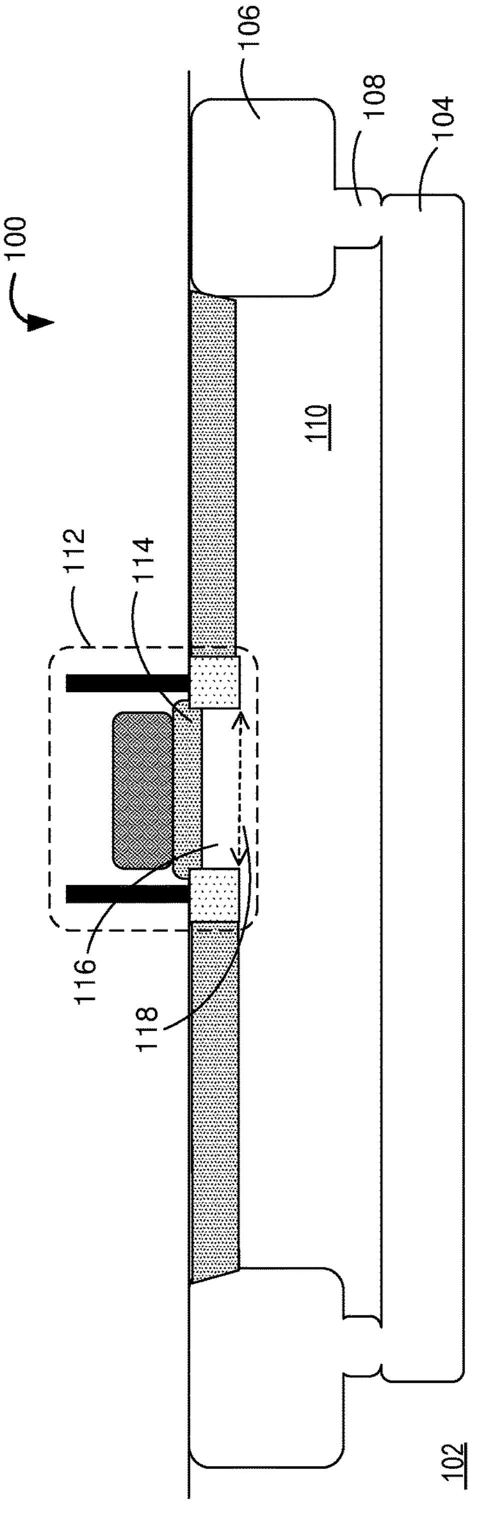
FIG. 1A is a schematic cross-sectional view of a first semiconductor device.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

Several embodiments of semiconductor devices, packages, and/or assemblies in accordance with the present technology can include circuits (e.g., transistors) including one or more adjusted (bottom) wells. The transistors can be configured according to a triple-well (TW) structure that includes the adjusted wells (e.g., deep N-wells) embedded in a doped substrate (e.g., a P-substrate). The adjusted wells can be integral with or connected to complementary wells (e.g., N-wells complementing the P-substrate) that correspond to source and drain portions of the transistors. The complementary wells can be opposite or surround a gate portion of each transistor. The adjusted wells can be below the complementary wells and extend laterally between the complementary wells. Accordingly, the adjusted wells and the complementary wells can surround or define an isolated well (e.g., an isolated P-well) that matches the doping type of the substrate and/or complements that of the adjusted well.

The adjusted wells can be formed by implanting the doping material through patterned masks (e.g., oxide nitride masks) instead of implanting before the masking step. In other words, a manufacturing process for the transistors can include forming the patterned masks over the doped substrate, and then subsequently forming the adjusted wells. The resulting transistors/adjusted wells can have physical characteristics that are unique or byproducts of the manufacturing process. For example, the adjusted wells can have a depression that is defined by depth transition portion(s). Outer portions of the adjusted wells (e.g., portions near the complementary wells), corresponding to portions under the patterned masks, can have a first depth. Inner portions of the adjusted wells, corresponding to portions under the openings in the masks and/or the gate portions, can have a second depth greater than the first depth. The depression of the adjusted well can have a width that is greater than a gate interface width. In some embodiments, the depression can be configured such that the depth transition portion is laterally separated from the gate portion by an adjusted separation distance that is equal to or greater than the second depth.

Accordingly, the manufacturing process and the resulting physical characteristics can provide improved features of the TW structure while reducing/eliminating weaknesses thereof. For example, the adjusted wells can provide reduced noise levels and accurate state transitions in comparison to conventional transistors. Further, in comparison to conventional TW structures, the adjusted wells of the described embodiments can provide (1) improved connections or hook-up strength with the complementary wells by maintaining a relatively low first depth while (2) reducing/eliminating portions at risk of causing punch-through failures (e.g., in high-voltage Field Effect Transistor (FET) applications) by maintaining the second depth across the adjusted separation distance. Additionally, the manufacturing process can leverage existing process steps, thereby minimizing the adjustments, complexities, errors, and costs associated with the updates or adjustments in comparison to the conventional manufacturing process/sequence.

Deep Well Transistor (TW Structure)

FIG. 1A is a schematic cross-sectional view of a first semiconductor device 100 (e.g., an FET). The first device 100 can represent a first example of the TW structure or a first example of a deep N-well transistor device.

The first device 100 can include a substrate 102, such as a P-type semiconductor material, with a first bottom well 104 embedded therein. The bottom well 104 can have a type or doping (e.g., N-type) that is different from or complements the substrate 102. The bottom well 104 can correspond to the deep well or the third well of the TW structure.

The bottom well 104 can be connected to or integral with complementary wells 106 through implant portions 108. The complementary wells 106 can include portions having a type or doping matching the bottom well 104 and different than/complementary to that of the substrate 102. The complementary wells 106 can be adjacent to or surround source and drain portions of the first device 100. The implant portions 108 can correspond to vertical extensions having the same doping type as the wells 104 and 106. Accordingly, the implant portions 108 can effectively tie or integrate the wells 104 and 106 together and serve as sidewalls. In doing so, the combination of the wells 104 and 106 and the implant portions 108 can surround and/or define an isolated well 110 (e.g., an isolated P-well). The isolated well 110 can extend laterally between the complementary wells and upward from the bottom well 104 toward the top portion of the substrate 102/device 100.

The first device 100 can include a gate portion 112 above the bottom well 104 and between (e.g., along a lateral direction) the complementary wells 106. The gate portion 112 can be configured to control a current between the source and the drain (e.g., portions of the isolated well 110 and/or layers under corresponding source/drain contacts). The gate portion 112 can include a gate oxide 114 that is disposed between a contact or an external interface and the isolated well 110. In some embodiments, the gate oxide 114 can directly contact the external interface and the isolated well 110 or an open portion thereof (e.g., a gate interface portion 116). The gate interface portion 116 of the isolated well 110 and/or the gate oxide 114 can have a dimension (e.g., a gate interface width 118) measured along a lateral direction.

The bottom well 104 can have a dimension that is measured along the lateral direction and is greater than the gate interface width 118. For example, the bottom well 104 can have a generally planar shape/surface extending laterally between the complementary wells 106. The laterally extending portion of the bottom well 104 can have the dimension/width that is greater than the gate interface width 118.

The planar shape/surface can correspond to a generally constant thickness (e.g., a depth for the bottom well 104) for the isolated well 110 between the complementary wells 106. In other words, the bottom well 104 can have a generally constant depth for the portion(s) thereof extending between the complementary wells 106. The depth for the bottom well 104 can be controlled/configured to prevent current breaches or punch-through failures. In other words, the implant portions 108 can be used to control and increase a vertical distance or depth between the bottom well 104 and the gate portion 112 or a corresponding top surface of the substrate 102.

Figure 1B:
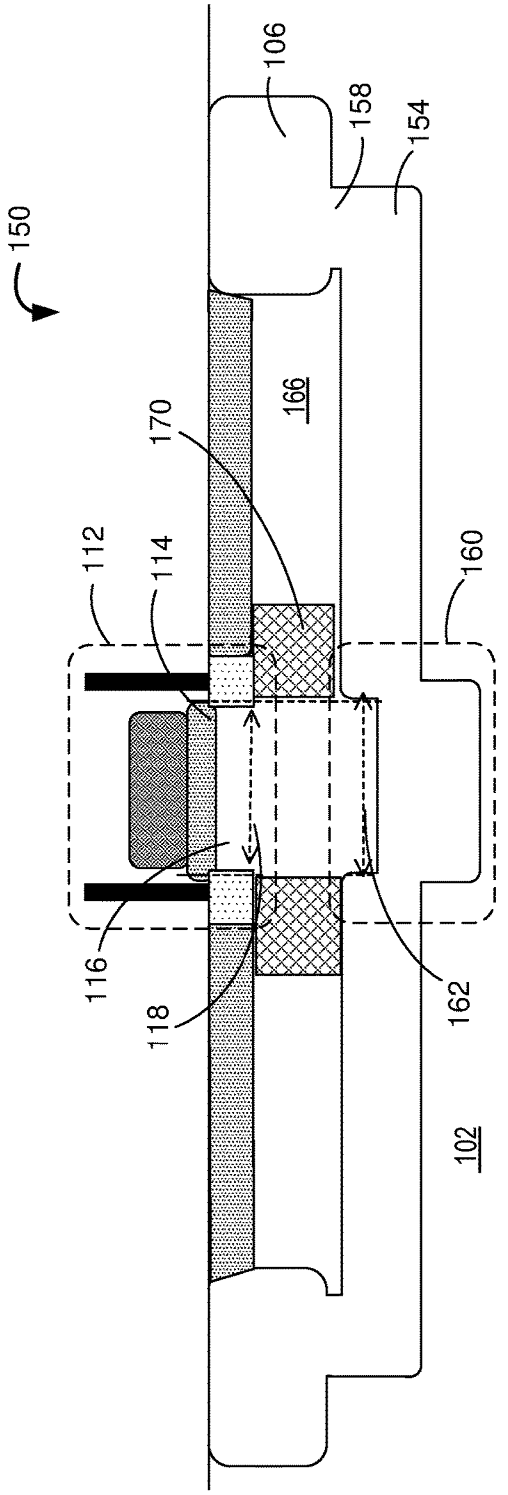
FIG. 1B is a schematic cross-sectional view of a second semiconductor device.

Similar to the first device 100, FIG. 1B is a schematic cross-sectional view of a second semiconductor device 150. The second device 150 can represent a second example of the TW structure or a second example of a deep N-well transistor device. The second device 150 can be similar to the first device 100 of FIG. 1A. For example, the second device 150 can include the substrate 102, the complementary wells 106, and the gate portion 112.

The second device 150 can include a second bottom well 154 and a second implant portion 158 that surrounds/defines an isolated well 166 (e.g., P-well) that respectively correspond to but different from the first bottom well 104, the first implant portion 108, and the isolated well 110. For example, the second implant portions 158 can have a dimension (e.g., a height measured along a vertical direction) that is less than that of the first implant portions 108. Also, the second bottom well 154 can have a bottom well depression 160 having a lower/deeper depth than other portions (e.g., portions closer to the implant portions 158. The bottom well depression 160 can have a dimension (e.g., a depression width 162) measured along a lateral direction. As such, the bottom well depression 160 can have edges that are surrounded/defined by depth transitions portions.

The bottom well depression 160 can be directly under and overlapped by the gate portion 112. Accordingly, the bottom well depression 160 can have the edges or peripheral portions aligned with those of the gate portion 112. The depression width 162 can generally match the gate oxide width 118. In some embodiments, the dimensions and the shape of the bottom well depression 160 can correspond to forming the second bottom well 154 or the bottom well depression 160 thereof based on the gate oxide 114, such as implanting through the corresponding/shaped nitride layer.

Based on the bottom well depression 160, the isolated well 166 can have corresponding shape that deviates from a planar bottom portion of the isolated well 110 of FIG. 1A. For example, the isolated well 166 can have a downward protrusion that corresponds to, aligned with, and/or overlaps the bottom well depression 160. The isolated well 166 can have zones 170 (e.g., risk zones) that are laterally adjacent to the gate interface portion 116 and/or the bottom well depression 160. The zones 170 can correspond to areas in the isolated well 166 having separating distances (e.g., along diagonal directions) between the gate portion 112 or the gate interface portion 116 and the corresponding portions/locations outside of or adjacent to the bottom well depression 160. Such separating distances for the zones 170 can be less than a depth for the bottom well depression 160. Accordingly, the zones 170 can have higher risk of punch-through (e.g., current flow along a vertical direction, such as between the drain and the bottom well). For example, the device 150 configured for high-voltage FET applications can have relatively weak or decreased isolation between the source/drain and the second bottom well 154 and/or the bottom well depression 160 due to the zones 170.

Adjusted Deep Well Transistor (Adjusted TW Structure)

Figure 2:
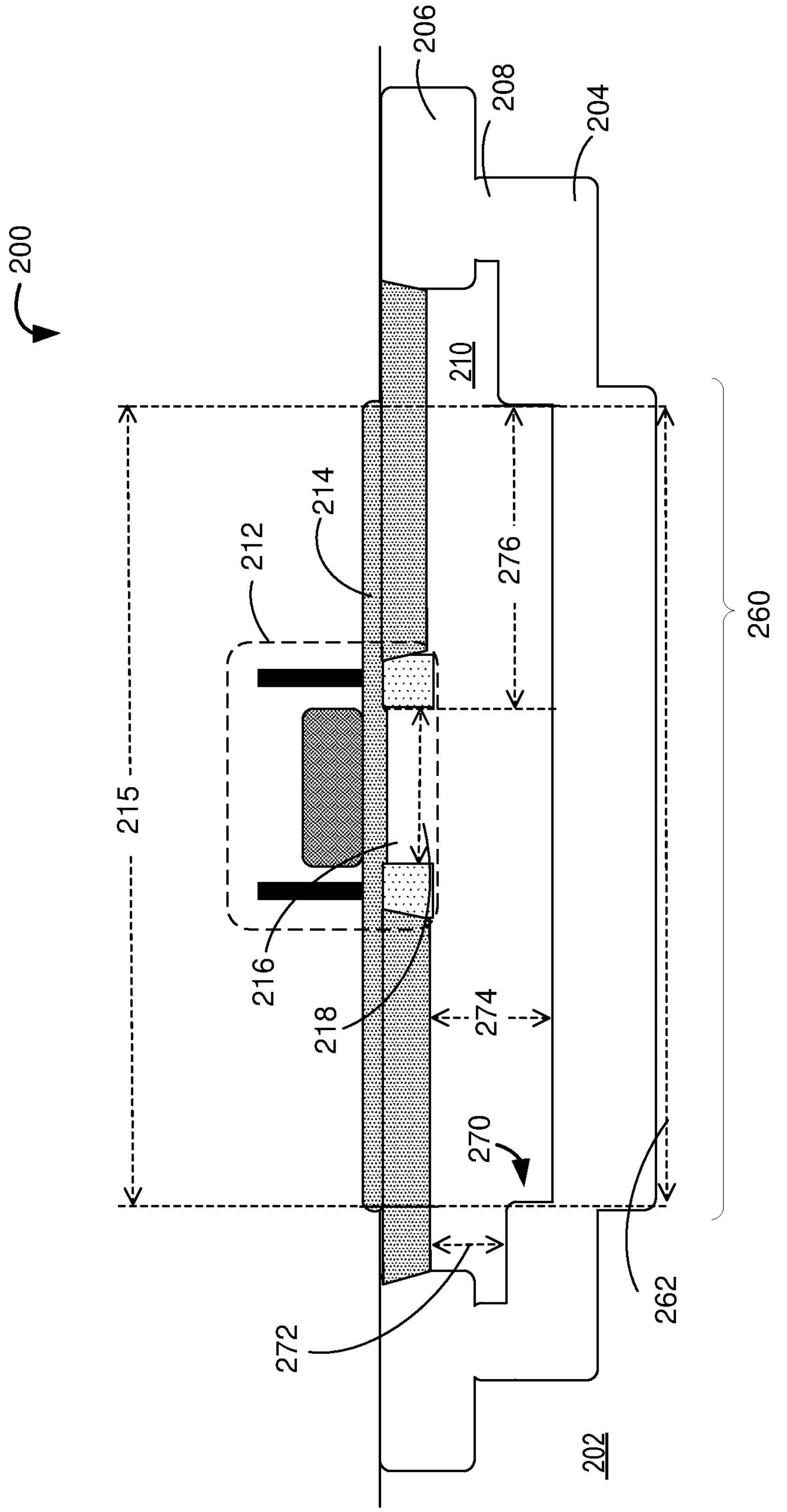
FIG. 2 is a schematic cross-sectional view of a third semiconductor device in accordance with embodiments of the technology.

FIG. 2 is a schematic cross-sectional view of a third semiconductor device 200 (e.g., an adjusted TW device) in accordance with embodiments of the technology. The device 200 can include a transistor (e.g., the FET) that includes a substrate 202 (e.g., P-type substrate) with complementary wells 206 (e.g., N-type wells) embedded therein. The complementary wells 206 can be connected to or integral with an adjusted bottom well 204 (e.g., an N-type deep/triple/third well) connected to or integral with the complementary wells 206 through implant portions 208. The adjusted bottom well 204 can surround/define an isolated well 210 (e.g., P-type isolated well) extending laterally between the complementary wells 206 and vertically between a top portion (e.g., a top surface of the substrate 202 and/or any corresponding nitride layer) of the device 200 and the adjusted bottom well 204. The complementary wells 206 and/or the adjusted bottom well 204 can surround the activatable portions of the device 200. In other words, the complementary wells 206 can surround the source and the drain portions of the transistor. The transistor can be isolated from the complementary wells 206 and/or the adjusted bottom well 204 (e.g., the N-tub).

Further, the device 200 can include a gate portion 212. The gate portion 212 can include a gate oxide 214 disposed between a gate contact or other externally interfacing structure and a gate interface portion 216 of the isolated well 210. The gate interface portion 216 can have a dimension (e.g., a gate interface width 218) measured along a lateral direction. Unlike the devices 100 and 150, the gate oxide 214 can have a dimension (e.g., an oxide width 215) that is different from or greater than the gate interface width 218.

The adjusted bottom well 204 can have a shape that is different from that of the devices 100 of FIG. 1A and 150 of FIG. 1B. The differences in the shapes can be caused by a manufacturing process that is different from those corresponding to the devices 100 and 150. Details regarding the manufacturing process for the third semiconductor device 200 are described below.

The difference in the shapes of the adjusted bottom well 204, along with the corresponding difference in shape for the isolated well 210, can correspond to an adjusted well depression 260 (e.g., a portion of the adjusted bottom well 204 having maximum depth or distance away from a top portion of the substrate 202). The adjusted bottom well 204 can include the adjusted well depression 260 having a generally planar shape or planar top surface and an adjusted width 262 between depth transition portions 270. The adjusted width 262 can be greater than the gate interface width 218. Additionally, the adjusted width can generally match the oxide width 215. The adjusted bottom well 204 can have a first depth 272 between the complementary wells 206 and the depth transition portions 270. Opposite the depth transition portions 270 and in the adjusted well depression 260, the adjusted bottom well 204 can have a second depth 274 that is greater than the first depth 272.

Based on the shape of the adjusted well depression 260, the adjusted bottom well 204 can have an adjusted separation distance 276 (measured along a lateral direction) between the gate portion 212 and/or the gate interface portion 216 and the depth transition portions 270. In other words, the adjusted bottom well 204 can have or maintain the second depth 274 across the adjusted separation distance 276 or along the portions of the adjusted bottom well 204 and/or the adjusted well depression 260 between peripheral portions/edges of the gate interface portion 216 and the depth transition portions 270. In some embodiments, the adjusted separation distance 276 can be equal to or greater than the second depth 274. Accordingly, the device 200 can maintain sufficient separation between the gate portion 212 and the adjusted bottom well 204, thereby effectively reducing/eliminating the risk zones 170 of FIG. 1B. Moreover, the device 200 can address the punch through issue without adding any more implants (e.g., p-type/Boron implants that may be used for the device 150) in the isolated well 210, which can negatively impact the device performance by causing higher body-effect (e.g., due to higher dopant concentration) and/or increasing the threshold voltage above a targeted range.

Additionally, the device 200 can use the adjusted bottom well 204 and the corresponding manufacturing process to establish the second depth 274 and the adjusted separation distance 276 using the shorter implant portions 208 instead of the elongated implant portions 108 of FIG. 1A. As such, the device 200 can improve the electrical connection or hook-up strength between the complementary wells 206 and the adjusted bottom well 204. For example, the adjusted bottom well 204 and the shorter implant portions 208 can reduce the corresponding connection resistance in comparison to the device 100 of FIG. 1A. The reduced resistance can correspond to reduction in the susceptibility or likelihood of leakage between the isolated well and the substrate.

Adjusted Manufacturing Process

Figure 3:
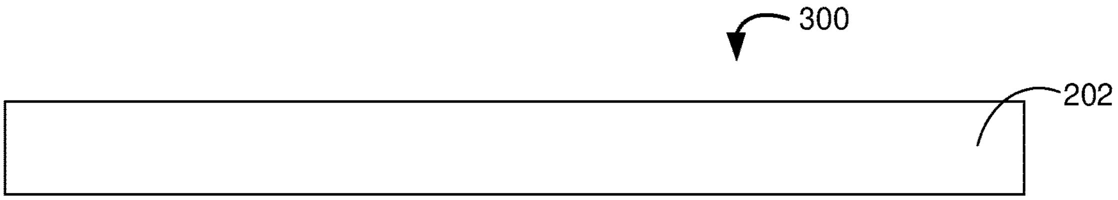
FIG. 3-FIG. 6 are illustrations of phases for a manufacturing process in accordance with embodiments of the technology.

As described above, one or more the physical characteristics of the semiconductor device 200 of FIG. 2 can result from a unique or an adjusted manufacturing process. FIG. 3-FIG. 7 are illustrations of phases for a manufacturing process in accordance with embodiments of the technology. FIG. 3 illustrates a phase 300 for providing a substrate, such as the substrate 202, provided for manufacturing.

Figure 4:
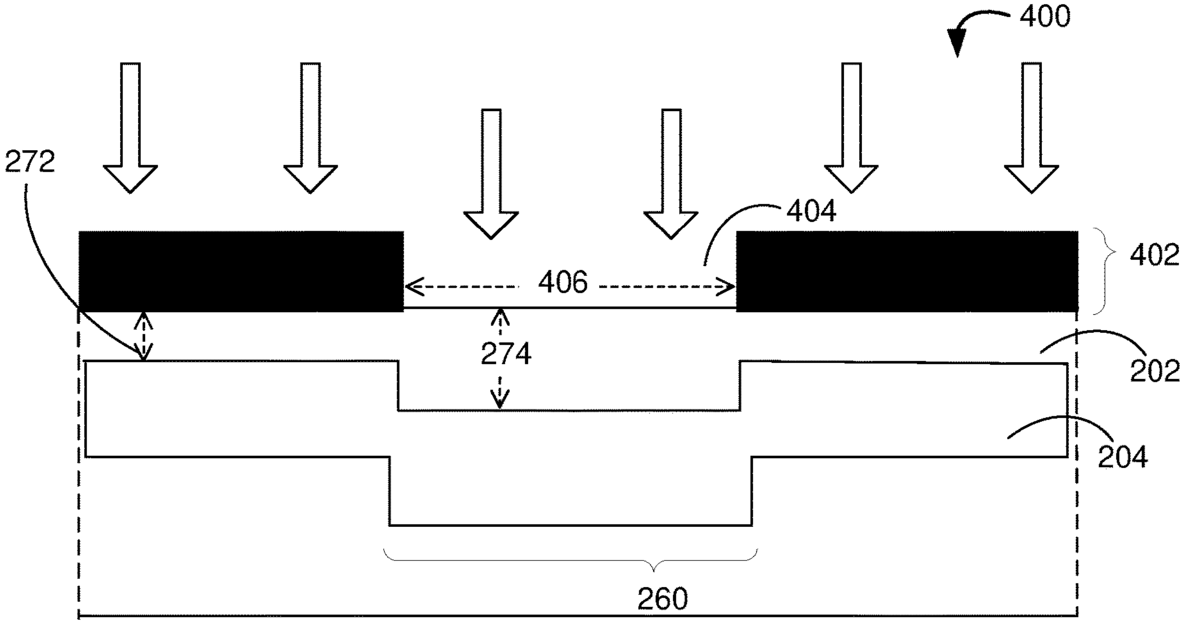

FIG. 4 illustrates a phase 400 for forming patterned masks 402 (e.g., high voltage oxide nitride masks) over the provided substrate 202. The patterned masks 402 can be formed using one or more techniques/steps for depositing material, photolithography, etching, or the like. As a result, the patterned masks 402 can have openings 404 that expose the substrate 202. One or more of the openings 404 can correspond to the gate interface portion 216 of FIG. 2. Accordingly, the openings 404 can have an opening width 406 that is configured to shape the adjusted well depression 260 and/or the oxide width 215 of FIG. 2.

The phase 400 can further correspond to forming the adjusted bottom well 204, such as by depositing doping (e.g., N-type) implants into the substrate 202. Instead of depositing the dopants directly to the substrate (at, e.g., the phase 300 of FIG. 3), the manufacturing method can include implanting the dopants through the patterned masks 402. As such, dopants implanted through the nitride mask portion can correspond to portions of the adjusted bottom well 204 having the first depth 272. Dopants implanted through the opening 404 can correspond to the adjusted well depression 260 and portions of the adjusted bottom well 204 having the second depth 274. The adjusted width 262 of the adjusted well depression 260 can correspond to the opening width 406.

By forming the adjusted bottom well 204 after forming the nitride oxides, the manufacturing process can form/shape the adjusted bottom well 204 and the adjusted well depression 260 thereof according to targeted shapes and dimensions. As described above, the resulting adjusted bottom well 204 can increase the hook-up strength while minimizing/eliminating the risk zones 170 of FIG. 1B. Moreover, since the adjusted bottom well 204 can be formed by essentially reordering or adjusting the sequence of phases/steps that are necessary to manufacture semiconductor devices (e.g., transistors, such as FETs), the adjusted manufacturing process can produce the targeted characteristics while minimizing costs, complexities, manufacturing errors, delays, or the like associated with the manufacturing adjustments.

Figure 5:
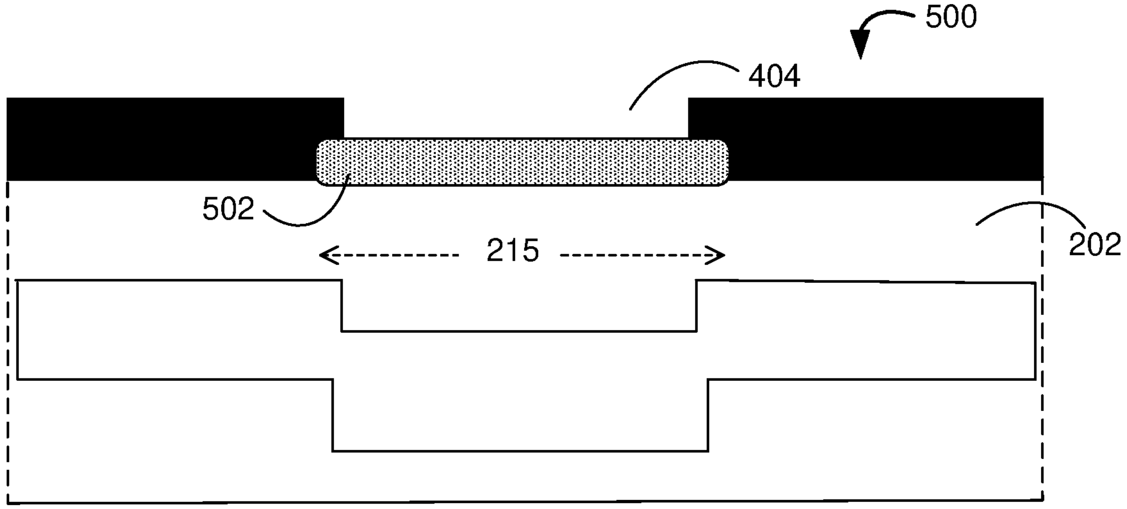

FIG. 5 illustrates a phase 500 for forming/growing/depositing oxide layers 502. The phase 500 can correspond to growing relatively thick oxides 502 where the silicon is exposed, such as on portions of the provided substrate 202 exposed through one or more of the openings 404 in the patterned masks 402. For example, the phase 500 can correspond to exposing the uncovered portions of the substrate 202 to oxygen. The oxide 502 can have the oxide width 215.

Figure 6:
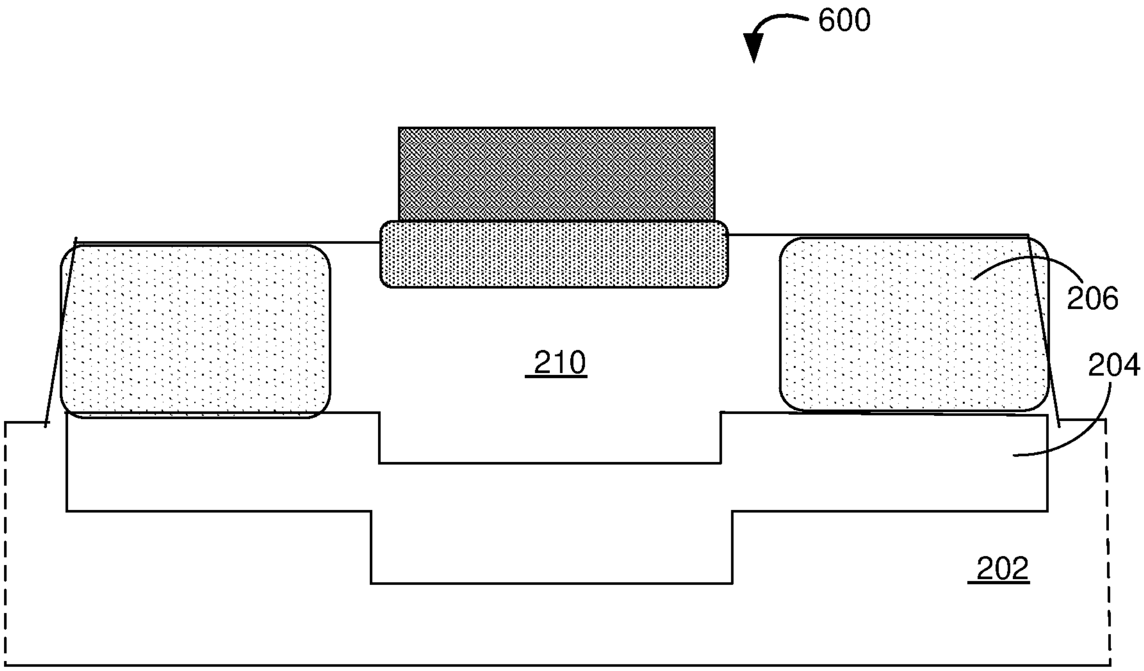

FIG. 6 illustrates a phase 600 for depositing low-voltage (e.g., relatively thin) oxide layer 602 and poly silicon (poly) 604 on the processed substrate 202. The phase 600 can include removing the patterned masks 402 of FIG. 5, growing/patterning a low-voltage (e.g., relatively thin) oxide layer, and depositing/patterning a poly silicon at least partially.

FIG. 6 illustrates a phase 600 for forming the device components. The phase 600 can include removing the patterned masks 402 of FIG. 5, growing/patterning a low-voltage (e.g., relatively thin) oxide layer, and depositing/patterning a poly silicon at least partially. The phase 600 can further include forming Shallow Trench Isolations (STIs) and forming the complementary wells 206. The phase 600 can form the STIs by masking and patterning/etching processes (e.g., dry etch using lithography, chemical and/or mechanical etching, or the like).

The complementary wells 206 can be formed by depositing dopants (e.g., N-type). The dopants can be deposited to at least the first depth 272 of FIG. 2 such that the dopants directly contact or electrically connect portions of the adjusted bottom well having the first/shallower depth. Accordingly, a portion of the complementary wells 206 and/or a separate portion of the dopants can form the implant portion 208 of FIG. 2. Moreover, the combination of the formed complementary wells 206 and the adjusted bottom well 204 can surround a portion of the provided substrate 202 and define the isolated well 210 of FIG. 2. The resulting structure can be further processed using one or more semiconductor manufacturing steps, such as to form the gate portion 212 of FIG. 2 between the complementary wells 206, to manufacture the semiconductor device 200 of FIG. 2 (e.g., deep N-well transistor or the TW transistor).

Figure 7:
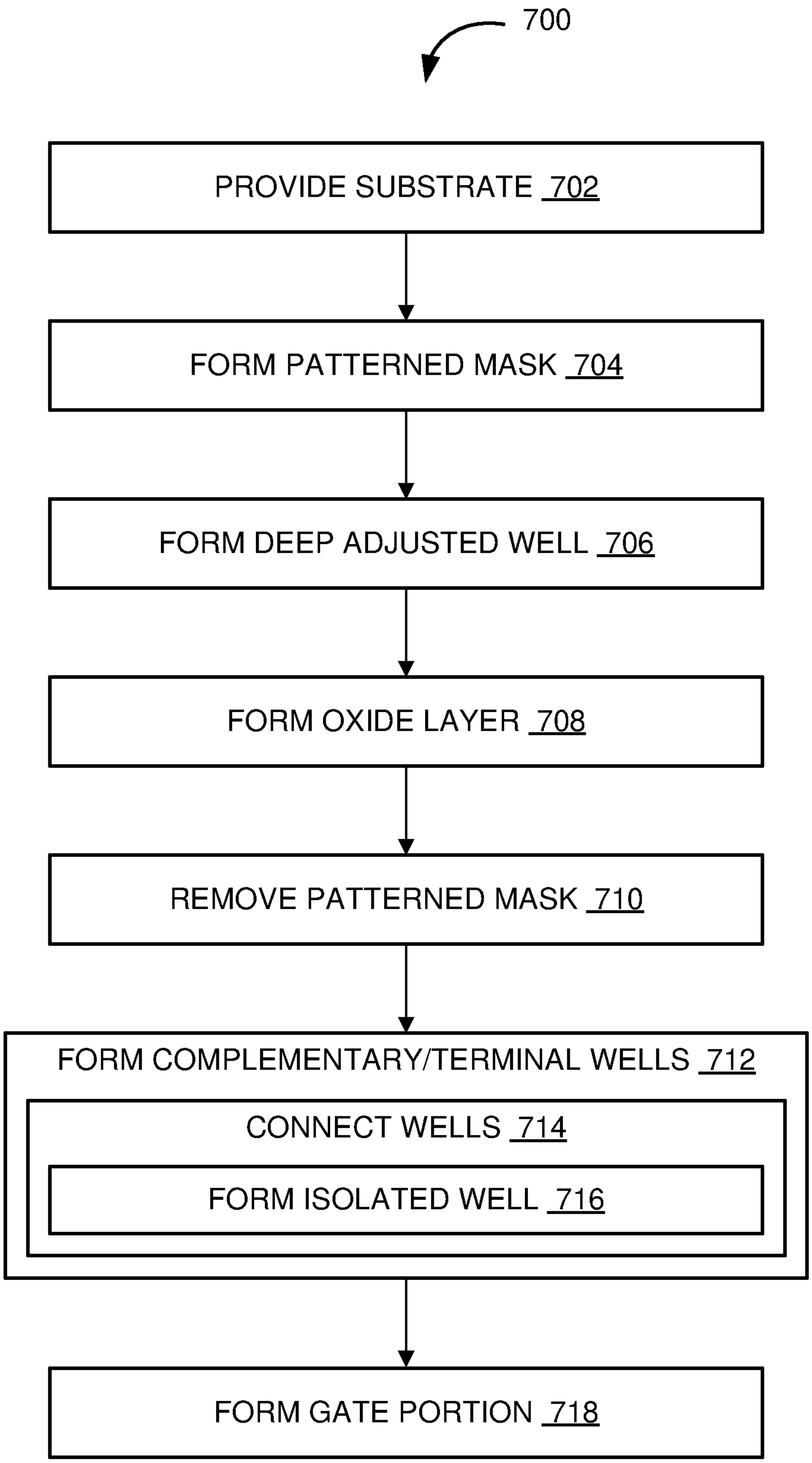
FIG. 7 is a flow diagram illustrating an example method of manufacturing an apparatus in accordance with an embodiment of the present technology.

FIG. 7 is a flow diagram illustrating an example method 700 of manufacturing an apparatus (e.g., the semiconductor device 200 of FIG. 2) in accordance with an embodiment of the present technology. The method 700 can include providing a semiconductor substrate (e.g., the substrate 202 of FIG. 2) as illustrated at block 702. The provided semiconductor substrate can have a first polarity/doping type. For example, a P-type semiconductor substrate can be provided, such as discuss above for the phase 300 of FIG. 3, for manufacturing a TW-structured FET device.

At block 704, patterned mask layer (e.g., the patterned mask layer 402 of FIG. 4) can be formed on/over the provided substrate. Forming the patterned mask layer can correspond to the phase 400 of FIG. 4. As an illustrate example, forming the patterned mask layer can include forming high-voltage oxide nitride masks with the opening 404 of FIG. 4, such as by depositing material, photolithography, etching, or the like. The patterned mask layer can include the opening 404 that exposes a top portion/surface of the semiconductor substrate 202. The patterned mask layer can be formed with the opening 404 having an opening width that corresponds to or matches the adjusted width 262 of FIG. 2 and/or the oxide width 215 of FIG. 2.

At block 706, a deep/adjusted well (e.g., the adjusted bottom well 204 of FIG. 2) can be formed within the semiconductor substrate 202 based on or using the patterned mask layer. The deep well can have a second polarity/doping type that is different than the first polarity/doping type of the semiconductor substrate 202. The deep well can be formed based on or using the patterned mask layer by implanting the dopants (e.g., N-type dopants into the P-type substrate) through the patterned mask layer and into inner/lower portions of the semiconductor substrate 202. As described above, the dopants can be implanted through the patterned mask layer at the phase 400 instead of directly into the semiconductor substrate 202 at phase 300. The resulting deep well can have (1) the first depth 272 of FIG. 2 for the peripheral portions of the deep well formed under masked portions of the layer and (2) the second depth 274 of FIG. 2 under the opening 404. As a result, the deep well can have a depression (e.g., the adjusted well depression 260 of FIG. 2) having the adjusted width 262 that matches/corresponds to the opening width.

The patterned mask layer and the opening 404 can be formed such that the resulting adjusted well depression 260 extends for the adjusted separation distance 276 of FIG. 2 along a lateral direction from a corresponding edge of a planned location of the gate portion 212 of FIG. 2. The opening width/location can be configured such that adjusted separation distance 276 is equal to or greater than the second depth 274. The adjusted well depression 260 can be configured to maintain the second depth 274 (1) across the adjusted separation distance 276 and (2) below and adjacent to the peripheral edge of the gate portion 212 for reducing or eliminating the risk zones 170 of FIG. 1.

At block 708, an oxide layer (e.g., corresponding to the gate oxide 214) can be formed on/over the semiconductor substrate using or according to the patterned mask layer. For example, the oxide layer 502 of FIG. 5 can be formed or grown in the opening 404 as described above for the phase 500 of FIG. 5. As a result, the oxide layer 502 can have the oxide width 215 corresponding to or matching the opening width and the adjusted width 262. In some embodiments, the oxide layer can be formed after the deep well.

At block 710, the patterned mask layer can be removed, such as by chemical/mechanical etching. The removal of the patterned mask layer can correspond to a portion of the phase 600 of FIG. 6.

At block 712, complementary wells (e.g., the complementary wells 206 of FIG. 2) can be formed in the semiconductor substrate outside of and/or adjacent to locations for current conducting/externally-interfacing terminals (e.g., source and drain terminals). For example, the complementary wells can be formed by implanting the second type dopants (e.g., N-type dopants into the P-type substrate) into the semiconductor substrate at locations planned for the terminals. The complementary wells can be formed over and/or overlapping the portions of the deep well having the first depth 272.

The implanting process can form the complementary wells that directly connect to the deep well or the implant portion 208 that connect the complementary wells to the deep well. Accordingly, the method 700 can include connecting the deep and complementary wells as illustrated at block 714. For example, the complementary wells and/or the implant portion 208 can have a length/height that is equal to or greater than the first depth 272. Accordingly, given the overlap, the complementary wells can be connected to the deep well.

Connecting the wells can correspond to or include forming an isolated well (e.g., the isolated well 210 of FIG. 2). The isolated well can correspond to a portion of the initially provided substrate that is above and surrounded by the connected combination of the adjusted bottom well 204, the complementary wells 206, and/or the implant portion 208. For example, the connected combination can form an N-type barrier that isolates or separates the P-type inner/isolated well from the outer or remaining portions of the P-type substrate. Accordingly, the method can form the TW structure for the overall device. Formation of the isolated well and the complementary wells can correspond to the phase 700 of FIG. 7.

At block 718, the method 700 can include forming a gate portion (e.g., the gate portion 212) over the semiconductor substrate and between the complementary wells. The gate portion 212 can be formed on/over the gate oxide 214. The gate portion 212 can be configured to provide controls for the current flow between the terminals. The gate portion 212 can correspond to the gate interface width 218 that is less than the adjusted width 262 of the adjusted well depression 260. The gate portion 212 can be located at the above described location such that the second depth 274 is maintained for the adjusted separation distance 276 along a lateral direction from its peripheral edges.

Figure 8:
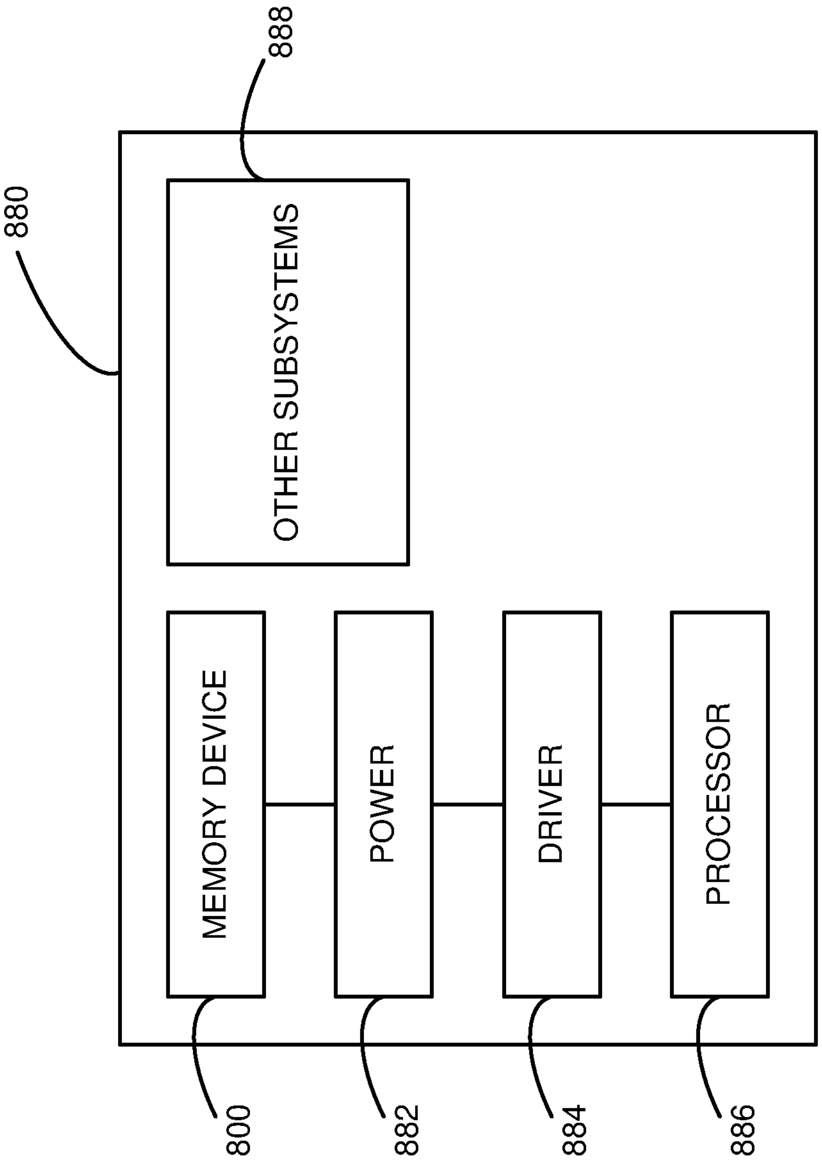
FIG. 8 is a schematic view of a system that includes an apparatus configured in accordance with embodiments of the present technology.

FIG. 8 is a schematic view of a system that includes an apparatus in accordance with embodiments of the present technology. Any one of the semiconductor devices described above with reference to FIGS. 1A-7 can be incorporated into any of a myriad of larger and/or more complex systems, a representative example of which is system 880 shown schematically in FIG. 8. The system 880 can include a semiconductor device 800 ("device 800") (e.g., a semiconductor device, package, and/or assembly), a power source 882, a driver 884, a processor 886, and/or other subsystems or components 888. The device 800 can include features generally similar to those devices described above. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, and appliances. Components of the system 880 may be housed in a single unit or distributed over multiple, interconnected units (e.g., through a communications network). The components of the system 880 can also include remote devices and any of a wide variety of computer-readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

What is claimed is:

1. A method of manufacturing a semiconductor device, the method comprising:

providing a semiconductor substrate having a first polarity type and at least a portion with a planar lateral surface;

forming a patterned mask layer over and covering at least a portion of the planar lateral surface the semiconductor substrate;

forming a deep well through the planar lateral surface using the patterned mask layer, wherein the deep well has (1) a second polarity type different from the first polarity type and (2) an adjusted well depression having a depression width measured along a lateral direction across opposing edges of a concave surface of the adjusted well depression;

removing the patterned mask layer to re-expose the at least a portion of the planar lateral surface;

forming a pair of complementary wells in the semiconductor substrate, the pair of complementary wells are formed above and connected to corresponding peripheral ends of the deep well, wherein the complementary wells are adjacent to, directly contacting, and peripheral to current flowing terminals of the semiconductor device, wherein the complementary wells connected to the deep well surround and define an isolated well in the semiconductor substrate dedicated to provide a current flow along a length of one corresponding current channel, wherein the concave surface is continuously concave between the complementary wells; and forming a gate portion over the semiconductor substrate and between the complementary wells, the gate portion configured to control the current flow between the current flowing terminals, wherein the gate portion corresponds to a gate interface width that overlaps the depression width and is less than the depression width.

2. The method of claim 1, wherein:

the patterned mask layer is formed with an opening therein that exposes a top portion of the semiconductor device, wherein the opening has an opening width that (1) corresponds to the depression width and (2) is greater than the gate interface width; and the deep well is formed having (1) peripheral portions having a first depth and below masked portions of the patterned mask layer and (2) a second depth below the opening, wherein the second depth is greater than the first depth and corresponds to the adjusted well depression of the deep well, wherein the first and second depths are measured along a vertical direction from a top surface of the semiconductor substrate to the corresponding portions of the deep well.

3. The method of claim 2, wherein:

the gate portion is formed having a peripheral edge; and the adjusted well depression of the deep well extends for an adjusted separation distance along the lateral direction from the peripheral edge of the gate portion, wherein the adjusted separation distance is equal to or greater than the second depth.

4. The method of claim 3, wherein the adjusted well depression maintains the second depth across the adjusted separation distance below and adjacent to the peripheral edge for reducing or eliminating zones between the gate portion and the deep well that are at risk of punch-through failures.

5. The method of claim 2, wherein forming the deep well includes implanting dopants corresponding to the second polarity type through the patterned mask layer instead of implanting the dopants directly onto the semiconductor substrate before forming the patterned mask layer.

6. The method of claim 2, further comprising:

forming an oxide layer over the semiconductor substrate and in the opening of the patterned mask layer, the oxide layer having a width that matches the depression width and greater than the gate interface width, wherein the oxide layer corresponds to a gate oxide for the gate portion.

7. The method of claim 2, wherein forming the deep well includes implanting dopants corresponding to the second polarity type through the patterned mask layer before forming the oxide layer.

8. The method of claim 1, wherein forming the complementary wells includes forming an isolated well by separating a portion of the semiconductor substrate from a remaining portion thereof using a combination of the complementary wells and the deep well.

9. The method of claim 8, wherein the corresponding semiconductor device is a Field-Effect Transistor (FET) with a triple well (TW) structure that includes the deep well and the isolated well of different polarity types.

10. The method of claim 1, wherein forming the complementary wells includes forming implant portions that connect the complementary wells to peripheral portions of the deep well, wherein a combination of the complementary wells and the implant portions have a depth that is less than a maximum depth associated with the adjusted well depression of the deep well.

* * * * *